United States Patent
Hamann et al.

(10) Patent No.: US 10,599,991 B2
(45) Date of Patent: Mar. 24, 2020

(54) PARAMETER-DEPENDENT MODEL-BLENDING WITH MULTI-EXPERT BASED MACHINE LEARNING AND PROXY SITES

(71) Applicant: International Business Machines Corporation, Armonk, NY (US)

(72) Inventors: Hendrik F. Hamann, Yorktown Heights, NY (US); Youngdeok Hwang, White Plains, NY (US); Levente Klein, Tuckahoe, NY (US); Jonathan Lenchner, North Salem, NY (US); Siyuan Lu, Yorktown Heights, NY (US); Fernando J. Marianno, New York, NY (US); Gerald J. Tesauro, Croton-on-Hudson, NY (US); Theodore G. van Kessel, Millbrook, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1052 days.

(21) Appl. No.: 14/798,844

(22) Filed: Jul. 14, 2015

(65) Prior Publication Data
US 2017/0017896 A1 Jan. 19, 2017

Related U.S. Application Data

(63) Continuation of application No. 14/797,777, filed on Jul. 13, 2015.

(51) Int. Cl.
*G06N 20/00* (2019.01)
*G06F 17/50* (2006.01)
(Continued)

(52) U.S. Cl.
CPC ........... *G06N 20/00* (2019.01); *G06F 16/285* (2019.01); *G06F 17/10* (2013.01); *G06F 17/5009* (2013.01)

(58) Field of Classification Search
CPC . G06N 99/005; G06F 17/10; G06F 17/30598; G06F 17/5009
See application file for complete search history.

(56) References Cited

U.S. PATENT DOCUMENTS

| 2,702,471 | A | 2/1955 | Vonnegut |
| 4,929,079 | A | 5/1990 | Delfour |

(Continued)

FOREIGN PATENT DOCUMENTS

JP 2011159199 A 8/2011

OTHER PUBLICATIONS

Griensven, et al., "A global sensitivity analysis tool for the parameters of multi-variable catchment models", Journal Hydrology 324 (2006) 10-23 (Year: 2006).*

(Continued)

*Primary Examiner* — Li B. Zhen
*Assistant Examiner* — Tsu-Chang Lee
(74) *Attorney, Agent, or Firm* — Cantor Colburn LLP; Vazken Alexanian

(57) ABSTRACT

A parameter-based multi-model blending method and system are described. The method includes selecting a parameter of interest among parameters estimated by each of a set of individual models, running the set of individual models with a range of inputs to obtain a range of estimates of the parameters from each of the set of individual models, and identifying, for each of the set of individual models, critical parameters among the parameters estimated, the critical parameters exhibiting a specified correlation with an error in estimation of the parameter of interest. For each subspace of (Continued)

combinations of the critical parameters, obtaining a parameter-based blended model is based on blending the set of individual models in accordance with the subspace of the critical parameters, the subspace defining a sub-range for each of the critical parameters.

16 Claims, 8 Drawing Sheets

(51) Int. Cl.
  *G06F 16/28* (2019.01)
  *G06F 17/10* (2006.01)

(56) References Cited

U.S. PATENT DOCUMENTS

| | | | |
|---|---|---|---|
| 5,221,927 | A | 6/1993 | Palmer |
| 5,777,481 | A | 7/1998 | Vivekanandan |
| 7,082,382 | B1 | 7/2006 | Rose, Jr. et al. |
| 8,244,502 | B2 | 8/2012 | Hamann et al. |
| 8,306,794 | B2 | 11/2012 | Hamann et al. |
| 8,594,985 | B2 | 11/2013 | Hamann et al. |
| 8,630,724 | B2 | 1/2014 | Hamann et al. |
| 8,718,939 | B2 | 5/2014 | Hamann et al. |
| 8,725,459 | B2 | 5/2014 | Herzig |
| 8,731,883 | B2 | 5/2014 | Hamann et al. |
| 8,849,630 | B2 | 9/2014 | Amemiya et al. |
| 8,949,040 | B2 | 2/2015 | Chey et al. |
| 9,109,989 | B2 | 8/2015 | Hamann et al. |
| 9,170,033 | B2 | 10/2015 | Kroyzer |
| 9,229,132 | B2 | 1/2016 | Guha et al. |
| 9,258,932 | B2 | 2/2016 | Hamann et al. |
| 9,412,673 | B2 * | 8/2016 | Kim ................... G03F 7/70616 |
| 2007/0027664 | A1 | 2/2007 | Anderson |
| 2011/0002194 | A1 | 1/2011 | Imhof et al. |
| 2011/0191680 | A1 * | 8/2011 | Chae ................... G06F 3/0436 715/716 |
| 2011/0295575 | A1 | 12/2011 | Levine |
| 2011/0299079 | A1 | 12/2011 | Fugal |
| 2012/0097543 | A1 | 4/2012 | Anekal |
| 2013/0117608 | A1 | 5/2013 | Kirby |
| 2013/0231906 | A1 | 9/2013 | Luvalle |
| 2014/0075108 | A1 | 3/2014 | Dong et al. |
| 2014/0309511 | A1 | 10/2014 | Stal |
| 2014/0324350 | A1 | 10/2014 | Amann et al. |
| 2014/0324352 | A1 | 10/2014 | Hamann et al. |
| 2015/0347922 | A1 | 12/2015 | Hamann et al. |
| 2016/0007426 | A1 | 1/2016 | Ashdown |

OTHER PUBLICATIONS

StackExchange, "Derivation of multivariable Taylor series", https://math.stackexchange.com/questions/221669/derivation-of-multivariable-taylor-series, Oct. 26, 2012 (Year: 2012).*
List of IBM Patents or Patent Applications Treated as Related; (Appendix P), Filed Feb. 4, 2016; 2 pages.
Hendrik F. Hamann et al., "A Situation-Dependent Blending Method for Predicting the Progression of Diseases or Their Responses to Treatments" U.S. Appl. No. 14/967,551, filed Dec. 14, 2015.
List of IBM Patents or Patent Applications Treated as Related; (Appendix P), Filed Jul. 14, 2015; 2 pages.
Hendrik F. Hamann et al., "Parameter-Dependent Model-Blending With Multi-Expert Based Machine Learning and Proxy Sites" U.S. Appl. No. 14/797,777, filed Jul. 13, 2015.
Hendrik F. Hamann et al., "Parameter-Dependent Model-Blending With Multi-Expert Based Machine Learning and Proxy Sites" U.S. Appl. No. 14/798,824, filed Jul. 14, 2015.
Hendrik F. Hamann et al., "Multi-Model Blending" U.S. Appl. No. 14/291,720, filed May 30, 2014.
A. Arakawa et al., "Interation of a Cumulus Cloud Ensemble with the Large-Scale Environment, Part I," Journal of the Atmospheric Sciences, vol. 31, No. 3, pp. 674-701 (1974).
AK Dewangan, P Agrawal. Classification of Deabetes Mellitus Using Machine Learning Techniques. International Journal of Engineering and Applied Sciences, May 5, 2015, vol. 2, Issue 5, p. 145-148.
ASM Salih, A Abraham. Novel Ensemble Decision Support and Health Care Monitoring System. Journal of Network and Innovative Computing, 2014, vol. 2, pp. 041-051.
D.P. Donovan et al., "Cloud effective particle size and water content profile retrievals using combined lidar and radar observations 2. Comparison with IR radiometer and in situ measurements of ice clouds," Journal of Geophysical Research, vol. 106, No. D21, Nov. 2001, pp. 27,449-27,464.
E.J. Kennelly et al., "Physical retrieval of cloud-top properties using optimal spectral sampling," Proceedings of SPIE, vol. 5890, 589019, Sep. 2005. 8 pages.
F. Stahl, R. Johansson and E Renard. Bayesian Combination of Multiple Plasma Glucose Predictors. 34th Annual International Conference of the Ieee EMBS, San Diego, California USA, Aug. 28-Sep. 1, 2012. p. 2839-2844.
G. Videen et al., "Reconstruction of Aerosol Properties from Forward-scattering Intensities," Report ARL-MR-0763, Army Research Lab Adelphi MD Computational and Information Sciences Directorate, Jan. 2011. 24 pages.
Griensven et al., "A global sensitivity anaylysis tool for the parameters of multi-variable catchment models", Journal of Hydrology 324 (2006) 10-23 (Year: 2006).
H. Iwabuchi, "Efficient Monte Carlo Methods for Radiative Transfer Modeling," Journal of the Atmospheric Sciences, vol. 63, issue 9, p. 2324-2339 (Sep. 2006).
I. Guyon and A Elisseeff. An Introduction to Variable and Feature Selection. Journal of Machine Learning Research. 2003, vol. 3, p. 1157-1182.
J. Zhang, "The conference on Research of Artificial Neural Network Based on Nonparametric Regression Theory," 2010 International Conference on Internet Technology and Applications, pp. 1-4 (Aug. 20-22, 2010).
J.P. Fugal et al., "Cloud particle size distributions measured with an airborne digital in-line holographic instrument," Atmospheric Measurement Techniques, vol. 2, Mar. 2009, pp. 259-271.
J.R. Key et al. "Parameterization of shortwave ice cloud optical properties for various particle habits," Journal of Geophysical Research, vol. 107, No. D13, AAC7-1, (Jul. 2002).
J.R. Quinlan, "Induction of Decision Trees," Machine Learning, 1:81-106 (1986).
Jiang et al., "Fault Diagnosis for Batch Processes Using Multimodel FDA with Moving Window", 2005 International Conference on Neural Networks and Brain, 2005, vol. 1, pp. 564-568.
Karabatsos, "Adaptive-model Bayesian nonparametric regression," Electronic Journal of Statistics, vol. 6, pp. 2038-2068 (Dec. 2012).
Mallick et al., "A Resource Prediction Model for Virtualization Servers", High Performance Computing and Simulation (HPCS), 2012, pp. 667-671.
Nadembega et al., "A Path Prediction Model to Support Mobile Multimedia Streaming", Communication Software Services and Multimedia Applications Symposium, 2012, pp. 2001-2005.
Ou et al., "Remote Sensing of Cirrus Cloud Particle Size and Optical Depth Using Polarimetric Sensor Measurement," Journal of Atmospheric Science, vol. 62, Issue 12, 4371-4383 (Dec. 2005).
P.R. Field et al., "Parameterization of ice-particle size distributions for mid-latitude stratiform cloud," Quarterly Journal of the Royal Meteorological Society, vol. 131, No. 609, Jul. 2005, pp. 1997-2017.
Reji et al, "Modeling Yield Loss Due to Rice Stem Borer and Argo-Ecological Zonation", Ph.D Thesis, Division of Entomology, Indian Agricultural Research Institute, New Delhi—110 012, 2017 (Year: 2007).
RT Kurnik, JJ Oliver, SR Waterhouse, T dunn, Y Jayalakshmi, M Lesho, M Lopatin, J Tamada, C Wei, RO Potts. Application of the Mixture of Experts algorithm for signal processing in a noninvasive glucose monitoring system. Sensors and Actuators B. 1999, vol. 60 p. 19-26.
Shi, Jinghua, et al.; "A Survey of Optimization Models on Cancer Chemotherapy Treatment Planning"; Ann Oper Res; p. 1-26; 2011.

(56) References Cited

OTHER PUBLICATIONS

Snoek et al., "Practical Bayesian Optimization of Machine Learning Algorithms," Conference of the Neural Information Processing Systems Foundation (Dec. 2012).
Wang, Yao "A Novel Virtual Age Reliability Model for Time-to-Failure Prediction", 2010 IEEE International Integrated Reliability Workshop Final Report, 2010, pp. 102-105.
Y. Takano et al., "Solar Radiative Transfer in Cirrus Clouds. Part I: Single-Scattering and Optical Properties of Hexagonal Ice Crystals," Journal of the Atmospheric Sciences, vol. 46, No. 1 (Jan. 1989).
Y.X. Hu et al., "An Accurate Parameterization of teh Radiative Properties of Water Clouds Suitable for Use in Climate Models," J. Climate, 6, 728-742 (Apr. 1993).

\* cited by examiner

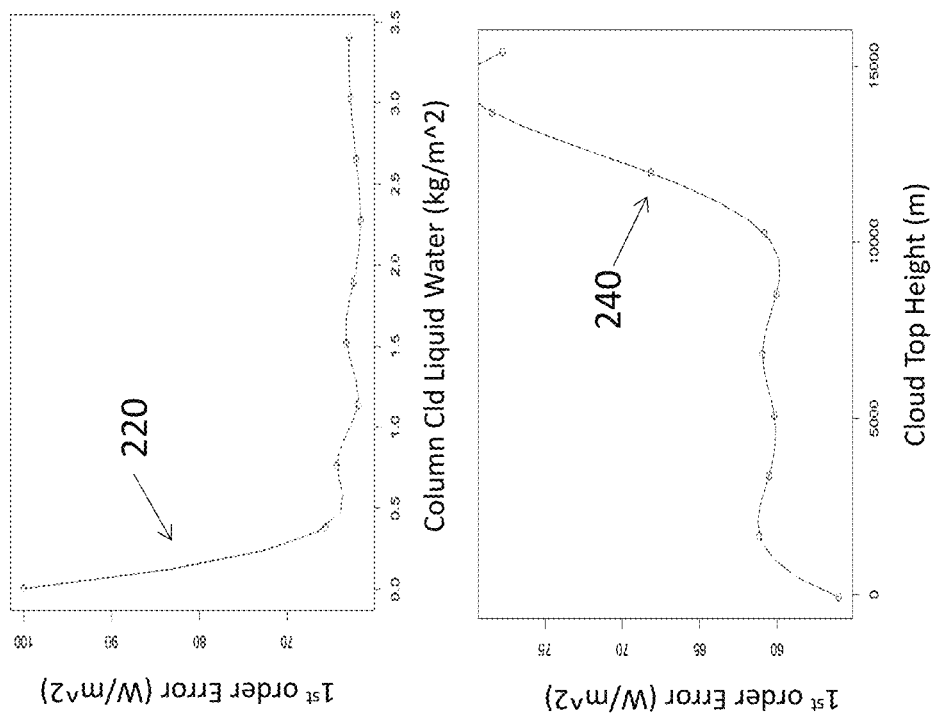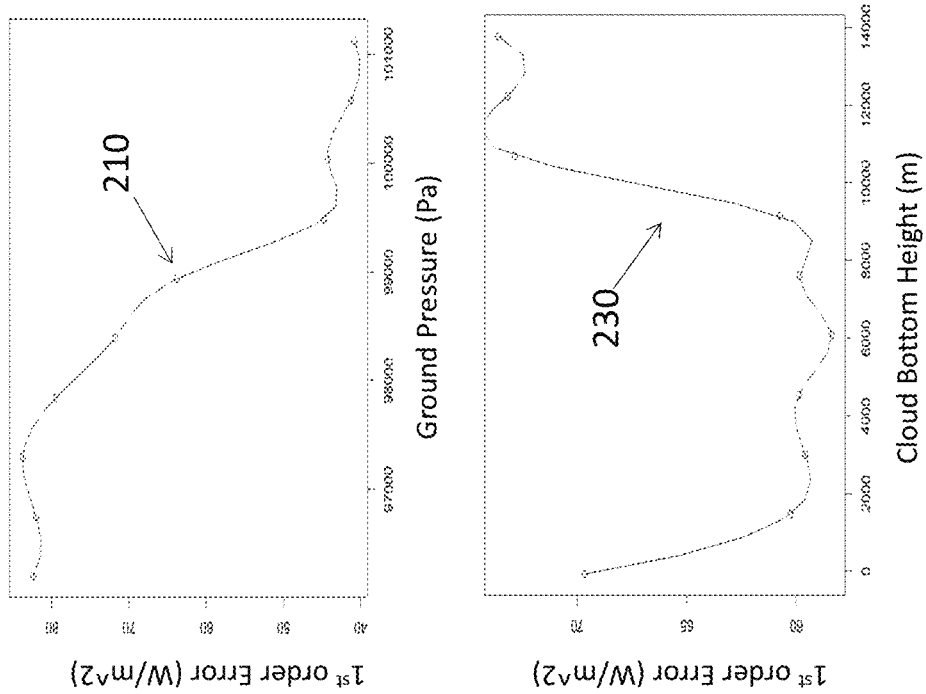
FIG. 2

PARAMETER-DEPENDENT MODEL-BLENDING WITH MULTI-EXPERT BASED MACHINE LEARNING AND PROXY SITES

DOMESTIC BENEFIT/NATIONAL STAGE INFORMATION

This application is a continuation of U.S. application Ser. No. 14/797,777 filed Jul. 13, 2015, the disclosure of which is incorporated by reference herein in its entirety.

STATEMENT REGARDING FEDERALLY SPONSORED RESEARCH OR DEVELOPMENT

This invention was made with Government support under DE-EE0006017 awarded by Department of Energy. The Government has certain rights to this invention.

BACKGROUND

The present invention relates to model blending, and more specifically, to parameter-dependent model-blending with multi-expert based machine learning and proxy sites.

Physical models that are based on principles of physics and chemistry and which are used to forecast parameters or conditions in a wide variety of arenas are known. Meteorological models may be used to forecast weather, for example. These models may include input parameters such as pressure, temperature, and wind velocity and provide estimates or predictions of output parameters. Corrosion models may forecast pipeline corrosion, as another example. These models may include input parameters such as temperature, gas concentrations, pressure, and flow conditions. Different physical models that provide the same predicted output condition or parameter may be blended to improve the prediction offered by any one of the models individually.

SUMMARY

According to an embodiment, a method of performing parameter-based multi-model blending includes selecting a parameter of interest among parameters estimated by each of a set of individual models; running, using a processor, the set of individual models with a range of inputs to obtain a range of estimates of the parameters from each of the set of individual models; identifying, for each of the set of individual models, critical parameters among the parameters estimated, the critical parameters exhibiting a specified correlation with an error in estimation of the parameter of interest; obtaining, for each subspace of combinations of the critical parameters, a parameter-based blended model based on blending the set of individual models in accordance with the subspace of the critical parameters, the subspace defining a sub-range for each of the critical parameters.

According to another embodiment, a system to perform parameter-based multi-model blending includes an input interface configured to receive inputs, the inputs including the parameter of interest among parameters estimated by each of a set of individual models; and a processor configured to run the set of individual models with a range of inputs to obtain a range of estimates of the parameters from each of the set of individual models, identify, for each of the set of individual models, critical parameters among the parameters estimated, the critical parameters exhibiting a specified correlation with an error in estimation of the parameter of interest, and obtain, for each subspace of combinations of the critical parameters, a parameter-based blended model based on blending the set of individual models in accordance with the subspace of the critical parameters, the subspace defining a sub-range for each of the critical parameters.

According to yet another embodiment, a non-transitory computer program product has computer readable instructions stored thereon which, when executed by a processor, cause the processor to implement a method of multi-model blending. The method includes selecting a parameter of interest among parameters estimated by each of a set of individual models; running the set of individual models with a range of inputs to obtain a range of estimates of the parameters from each of the set of individual models; identifying, for each of the set of individual models, critical parameters among the parameters estimated, the critical parameters exhibiting a specified correlation with an error in estimation of the parameter of interest; and obtaining, for each subspace of combinations of the critical parameters, a parameter-based blended model based on blending the set of individual models in accordance with the subspace of the critical parameters, the subspace defining a sub-range for each of the critical parameters.

According to yet another embodiment, a method of classifying sites to obtain a proxy site for a site of interest includes determining critical parameters among parameters estimated by one or more models associated with each of the sites, the parameters including the critical parameters, a parameter of interest, and other parameters, and the critical parameters being determined to be critical in estimation of the parameter of interest according to the one or more models; grouping two or more sites together in a same group when the two or more sites have same critical parameters; for each group of the two or more sites, classifying the two or more sites by type; correlating the type associated with each site with latitude, longitude, and elevation of the site; and obtaining, using a processor, the proxy site for the site of interest by determining the type correlated with latitude, longitude, and elevation of the site of interest.

According to yet another embodiment, a system to classify sites to obtain a proxy site for a site of interest includes an input interface configured to receive an input of a number of types; and a processor configured to determine critical parameters among parameters estimated by one or more models associated with each of the sites, the parameters including the critical parameters, a parameter of interest, and other parameters, and the critical parameters being determined to be critical in estimation of the parameter of interest according to the one or more models, to group two or more sites together in a same group when the two or more sites have same critical parameters, to classify the two or more sites of each group into a type, the number of types being specified in the input, to correlate the type associated with each site with latitude, longitude, and elevation of the site, and to obtain a proxy site for the site of interest by determining the type correlated with longitude, latitude, and elevation of the site of interest.

According to yet another embodiment, a non-transitory computer program product has computer readable instructions stored thereon which, when executed by a processor, cause the processor to implement a method of classifying sites to obtain a proxy site for a site of interest. The method includes determining critical parameters among parameters estimated by one or more models associated with each of the sites, the parameters including the critical parameters, a parameter of interest, and other parameters, and the critical parameters being determined to be critical in estimation of the parameter of interest according to the one or more models; grouping two or more sites together in a same group when the two or more sites have same critical parameters; for each group of the two or more sites, classifying the two or more sites by type; correlating the type associated with each site with latitude, longitude, and elevation of the site; and obtaining the proxy site for the site of interest by determining the type correlated with latitude, longitude, and elevation of the site of interest.

According to yet another embodiment, a method to determine a blended forecasting model includes storing historical data, the historical data including estimates and measurements of a parameter of interest and estimates of critical parameters, the critical parameters determined to be critical to an estimate of the parameter of interest; training a plurality of machine learning models with respective machine learning algorithms using training data that includes a first set of parameter values associated with a first range of time points, the first set of parameter values being obtained from the historical data; obtaining estimates of the parameter of interest with each of the machine learning models using a second set of parameter values associated with a second range of time points, the second set of parameter values being obtained from the historical data; determining, using a processor, a most accurate machine learning model among the machine learning models at each time point in the second range of time points; and determining the blended forecasting model based on the most accurate machine learning model determined for each time point in the second range of time points.

According to yet another embodiment, a multi-expert based machine learning system to determine a blended forecasting model includes a memory device to store historical data of parameters, the historical data including estimates and measurements of a parameter of interest and estimates of critical parameters determined to be critical to an estimate of the parameter of interest; and a processor configured to train a plurality of learning models with respective machine learning algorithms using training data that includes a first set of parameter values associated with a first range of time points obtained from the historical data, to obtain estimates of the parameter of interest with each of the machine learning models using a second set of parameter values associated with a second range of time points, the second set of parameter values being obtained from the historical data, to determine a most accurate machine learning model among the machine learning models at each time point in the second range of time points, and to determine the blended forecasting model from the most accurate machine learning models.

According to yet another embodiment, a non-transitory computer program product has computer readable instructions stored thereon which, when executed by a processor, cause the processor to implement a method of determining a blended forecasting model. The method includes obtaining historical data, the historical data including estimates and measurements of a parameter of interest and estimates of critical parameters, the critical parameters determined to be critical to an estimate of the parameter of interest; training a plurality of machine learning models with respective machine learning algorithms using training data that includes a first set of parameter values associated with a first range of time points, the first set of parameter values being obtained from the historical data; obtaining estimates of the parameter of interest with each of the machine learning models using a second set of parameter associated with a second range of time points, the second set of parameter values being obtained from the historical data; determining a most accurate machine learning model among the machine learning models at each time point in the second range of time points; and determining the blended forecasting model based on the most accurate machine learning model determined for each time point in the second range of time points.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2-5 illustrate the information and processes used to identify critical parameters according embodiments, in which:

FIG. 2 illustrates exemplary results of one individual model to be blended according to embodiments;

FIG. 3 illustrates an exemplary visualization of parameters that facilitates comparison of the correlation of each parameter with the error in estimating the parameter of interest;

FIG. 4 illustrates an exemplary visualization of parameters that facilitates comparison of the correlation of a pair of parameters with the error in the estimate of the parameter of interest; and FIG. 5 shows inter-model second order error dependence;

DETAILED DESCRIPTION

As noted above, a model may be used to forecast or estimate values of parameters or future conditions. Further, outputs of more than one model may be blended to improve the prediction provided by individual models, because no individual model is likely to be accurate in all situations. Embodiments of the systems and methods detailed herein relate to a parameter-dependent blend of individual models. For a given subspace of parameter values (a given situation), the performance of each individual model with respect to the parameter of interest is used to determine the appropriate blend of models for the given situation. As such, parameter-based (or situation-specific) errors may be essentially eliminated in the blended model. According to embodiments, a multi-expert based machine learning is used to obtain the blended model for each situation. According to embodiments, proxy sites may be identified for purposes of obtaining training data sets. When training the blended model, if historical data is not available at the site of interest, data from one or more proxy sites may be used instead.

Figure 1:
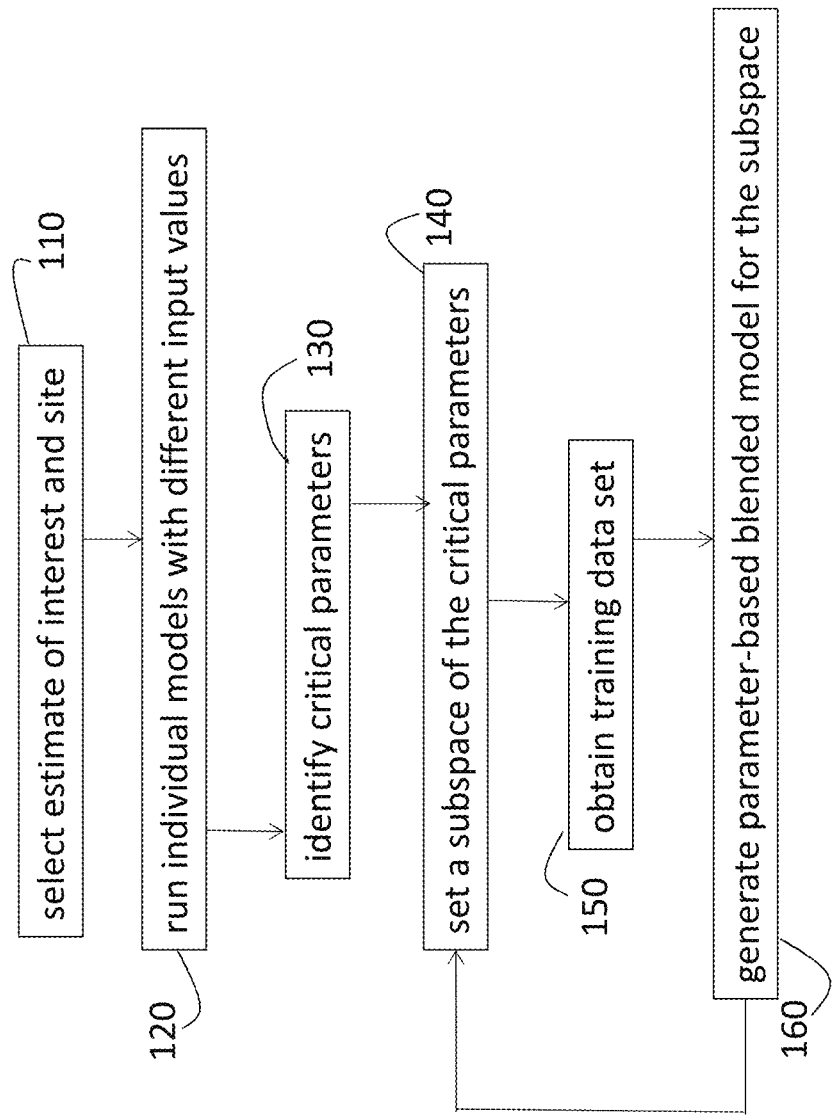
FIG. 1 is a process flow of a method of performing parameter-based model blending according to embodiments.

FIG. 1 is a process flow of a method of performing parameter-based model blending according to embodiments detailed herein. At block 110, selecting the estimate of interest and the site are performed. For purposes of explanation, a specific example of the estimate of interest being global horizontal irradiance (GHI) is discussed. The exemplary models discussed herein that estimate or predict GHI have different inputs based on the site of interest (physical location). However, other models may not be site-specific. As noted above, the discussion herein applies to any number of types of models and any estimate a parameter of interest associated with those models. Running individual models with different input values, at block 120, results in a range of predictions or estimates of parameters by each model. To be clear, while only estimate may be used herein, the models (individual and blended) may provide predictions of future parameter values as well as estimates of parameter values corresponding with a time at which input values were obtained. The range of estimates of parameters includes the estimate of the parameter of interest (a range of estimates of the parameter of interest). As detailed further below, identifying critical parameters, at block 130, includes identifying, among the parameters estimated by the individual models, those parameters that have the greatest influence on the error in the estimate of the parameter of interest. The parameter of interest itself may be one of the critical parameters. Once the critical parameters are identified, setting a subspace of the critical parameters, at block 140, is done iteratively and includes considering a combination of a sub-range of each critical parameter per iteration. The sub-range of values considered for a given critical parameter need not be continuous. As further discussed below, dependence of the error in the estimation of the parameter of interest may be similar for different sets of values of a critical parameter. Obtaining the parameter-based blended model, at block 160, may involve obtaining a training data set at block 150 for use with machine learning. This machine learning, according to embodiments detailed with reference to FIG. 6 below, may include multi-expert based machine learning. As further detailed below with reference to FIG. 7, the training data set may be from a proxy site rather than from the site selected at block 110.

FIGS. 2-5 illustrate the information and processes used to identify critical parameters according embodiments. FIGS. 2-5 relate to blocks 120 and 130 of FIG. 1.

FIG. 2 illustrates exemplary results of one individual model that will be blended according to embodiments detailed herein. Four different graphs 210, 220, 230, 240 are shown. Each graph shows the first order error dependence in GHI estimation corresponding with a range of estimations for another parameter. These graphs 210-240 result from functional analysis-of-variance (FANOVA) in the first order. FANOVA is a known technique of using statistical models to analyze variance and explain observations. Its application according to the present embodiment is to build a statistical model of prediction error (in predicting the parameter of interest by a given individual model) as a function of all input parameters. Error in GHI estimate may be computed as:

$$E = F(x_1, x_2, \ldots, x_n) \quad [EQ. 1]$$

EQ. 1 provides the model forecast error (E) of the parameter of interest (GHI in this example). $x_1, x_2, \ldots, x_n$ are the other n parameters that are also forecast (predicted or estimated) by the individual model. The statistical models are generally too noisy to be used directly and are therefore decomposed to $0^{th}$, $1^{st}$, $2^{nd}$, and higher order dependence of forecast error as follows:

$$F = f_0 + \sum_i f_i(x_i) + \sum_{i \neq j} f_{i,j}(x_i, x_j) + \ldots \quad [EQ. 2]$$

The first order dependence (of error in estimating the parameter of interest) on a single variable (another parameter estimated by the same individual model) is then given by:

$$f_i = \int F(x_1, \ldots, x_n) dx_1 \ldots dx_{i-1} d_{i+1} dx_n - f_0 \quad [EQ. 3]$$

Graphs 210-240 indicate this first order dependence $f_i$ for four different parameters (values of i) in FIG. 2. Graph 210 shows the first order error dependence in GHI estimates corresponding with estimates of ground pressure. Graph 210 indicates that the error decreases as the estimated ground pressure increases. Graph 220 shows the first order error dependence of GHI estimates corresponding with estimates of column cloud liquid water. Graph 220 indicates that error in the estimate of GHI decreases sharply when the estimated column cloud liquid water is over 0.5 kilograms per meters squared ($kg/m^2$). Graph 230 shows the first order error dependence of GHI estimates corresponding with estimates of cloud bottom height, and graph 240 shows the first order error dependence of GHI estimates corresponding with estimates of cloud top height. Graph 230 indicates a sharp rise in the error of the GHI estimate above a cloud bottom height estimate of 9000 meters (m), and graph 240 indicates an increase in the GHI estimate error above a cloud top height estimate of 10000 m. The error in the GHI estimate is a first order error because it depends on only one parameter, and the effects of other parameters on the estimation error are averaged out in EQ. 3.

Graph 230 is an example of sub-ranges of parameter values that have similar correlations with estimation error of the parameter of interest. That is, cloud bottom height values below 2000 have a similar correlation with first order GHI estimate error as do cloud bottom height values between 8,500 and 10,000 m. Thus, if cloud bottom height were determined to be a critical parameter, a training data set, discussed further below, would involve a sub-range that includes both 0 to 2,000 m and 8,500 to 10,000 m. This is an example of a non-continuous sub-range.

Figure 3:
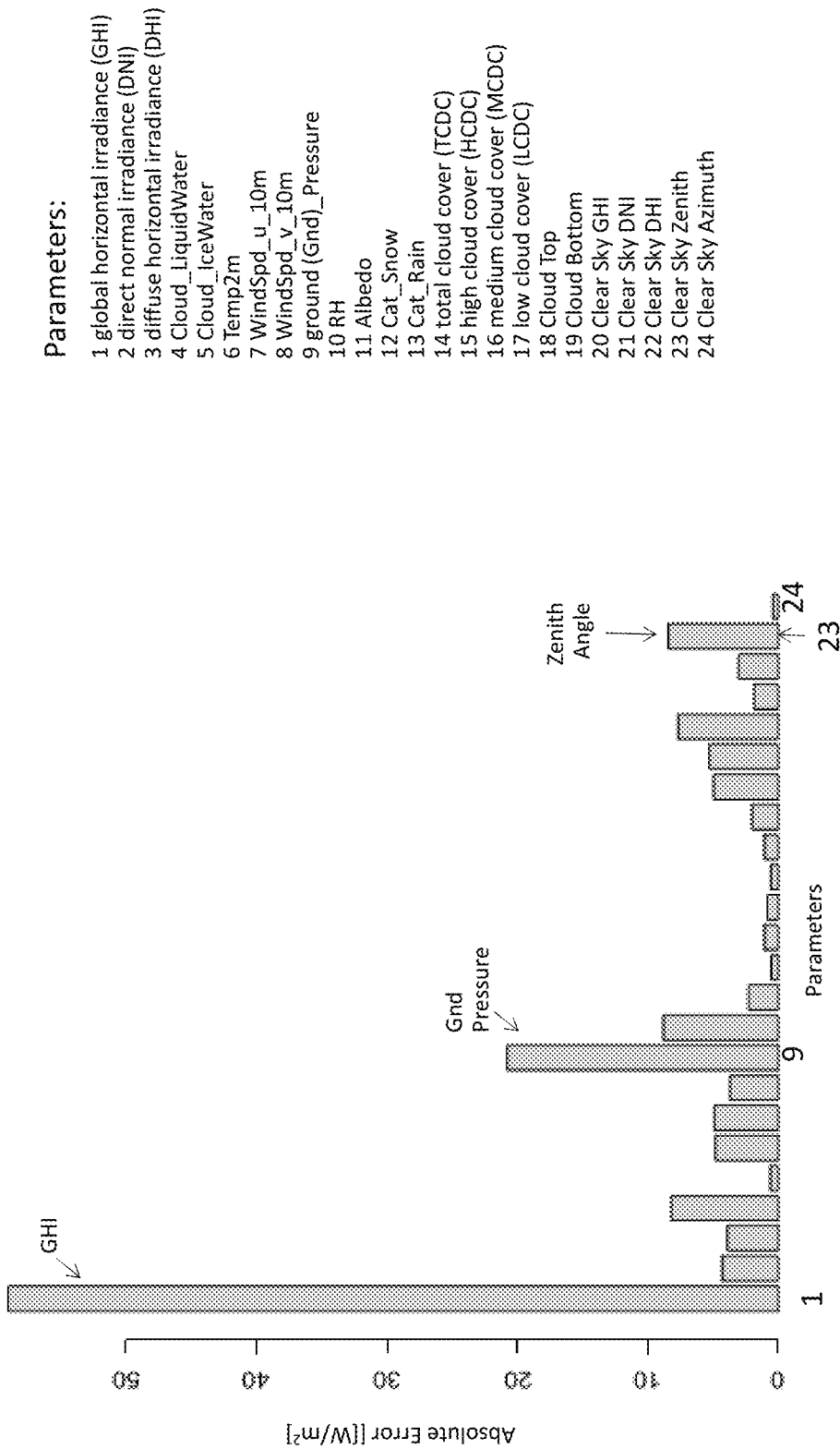

FIG. 3 illustrates an exemplary visualization of parameters that facilitates comparison of the correlation of each parameter with the first order error in estimating the parameter of interest (GHI in the example). Each bar shown in FIG. 3 indicates the standard deviation of the first order error in GHI estimate corresponding with a given parameter. That is, for graph 210 (FIG. 2), for example, the mean value of first order GHI estimate error is determined, and the deviation of each point on the graph 210 from the mean value is used to compute standard deviation. This computed standard deviation (obtained from graph 210) is shown as the bar associated with parameter 9 (ground pressure) in FIG. 3. Thus, the standard deviation is a measure of the spread in GHI estimate error dependence corresponding to each parameter and is given by:

$$\text{standard\_deviation} = \sqrt{\frac{\sum_{i=1}^{N}(X_i - \text{mean})^2}{N-1}} \quad [EQ. 4]$$

In EQ. 4, N is the total number of first order error dependence values associated with a given parameter (e.g., number of points in graph 210, FIG. 2), and $X_i$ refers to each first order error dependence value (each value in graph 210). All of the parameters (numbered 1 through 24) are estimated by an individual model at the site of interest. FIG. 3 indicates that ground pressure (parameter 9) and zenith angle (parameter 23) are important parameters in terms of first order error in GHI estimation. This identification of influential parameters may be based on setting a threshold for the standard deviations of the GHI error dependence on different parameters, for example. To identify critical parameters, the GHI second order error dependence on parameters is examined, as well, as described below.

Figure 4:
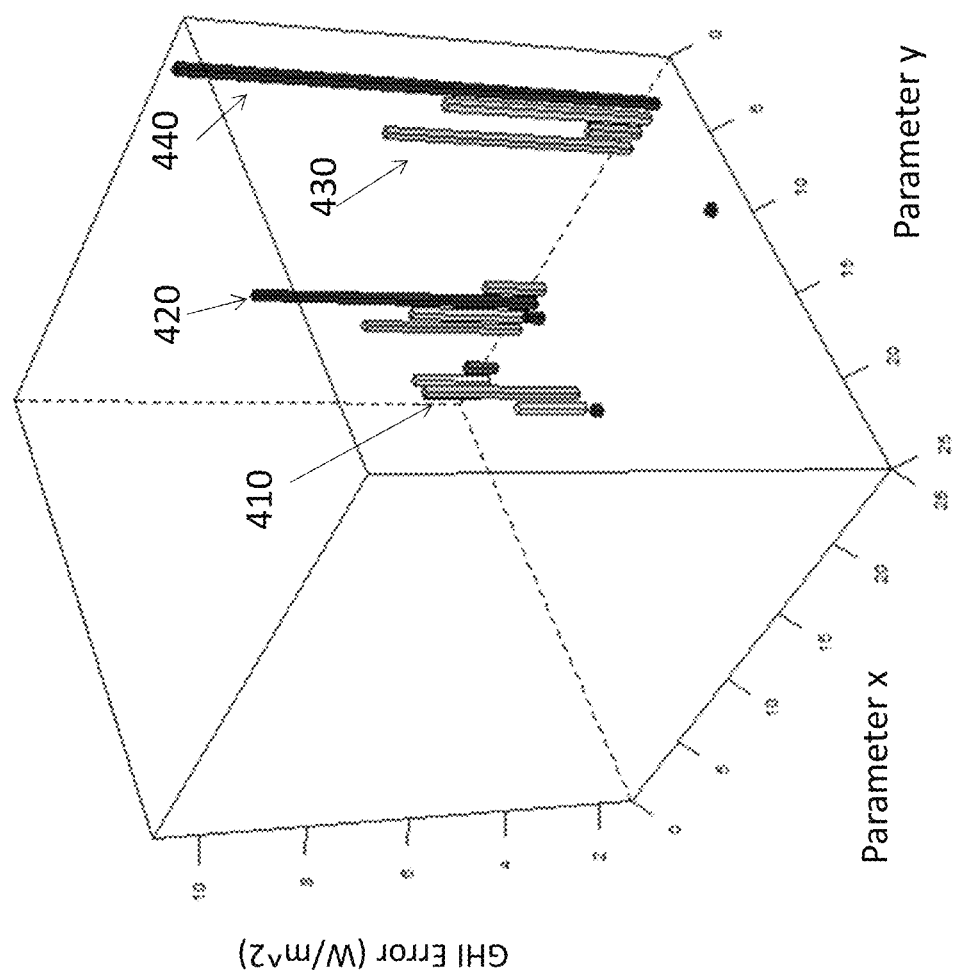
Figure 5:
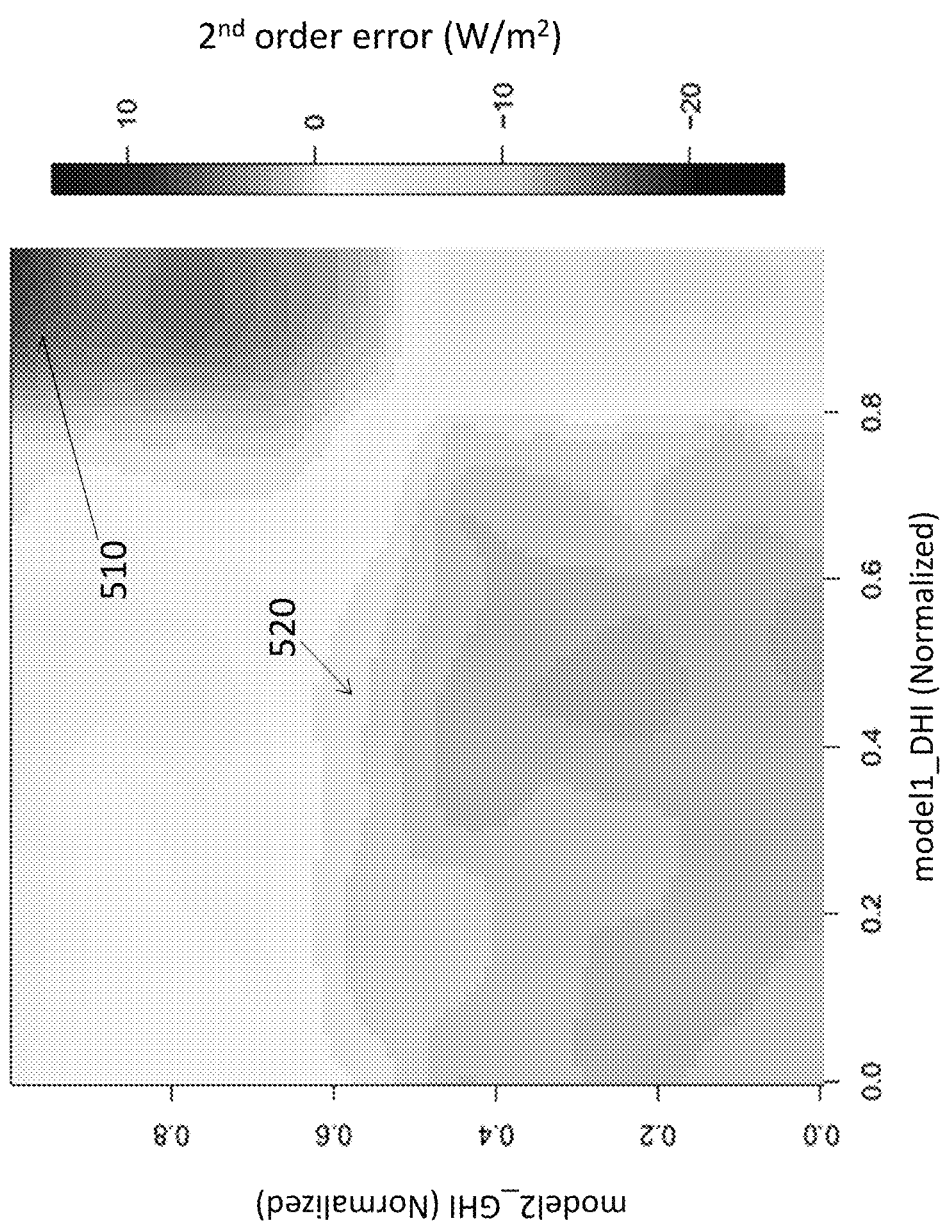

FIG. 4 illustrates an exemplary visualization of the standard deviation of the second order error in the estimate of the parameter of interest (e.g., GHI). FIG. 5 shows exemplary second order error dependence. As discussed with regard to FIGS. 2 and 3, FIG. 4 represents the result of determining the mean value of second order estimate error and then the standard deviation based on the deviation from that mean value at each point. While the standard deviation of the first order GHI estimation error dependence is based on one parameter (as discussed with reference to FIG. 3), the standard deviation of the second order GHI estimation error dependence ($W/m^2$) is based on a combination of two parameters, as indicated by each bar in FIG. 4. Thus, the standard deviation of the second order GHI error correlated with a combination of parameter 7 (wind speed) and parameter 9 (ground pressure) is shown as 410. The standard deviation of the second order GHI error correlated with parameter 9 (ground pressure) and parameter 1 (GHI) is shown as 420. Bar graphs 430 and 440 show the standard deviation of the second order GHI error correlated with a combination of parameter 20 (clear sky GHI) and parameter 1 (GHI) and with a combination of parameter 23 (zenith angle) and parameter 1 (GHI), respectively. A threshold value may be used to select these four combinations as influential combinations of parameters with respect to estimation error for GHI. The FANOVA second order dependence (derived from EQ. 2) is given by:

$$f_{i,j} = \int F(x_1, \ldots, x_n) dx_1 \ldots dx_{i-1} dx_{i+1} \ldots dx_{j-1} dx_{j+1} \ldots dx_n - f_i(x_i) - f_j(x_j) - f_0 \quad [EQ. 5]$$

As noted above, the information obtained from FIGS. 2-4 illustrate first and second order GHI estimation error associated with one individual model, and the process of examining the parameters is repeated for other individual models. The process of examining the parameters may also be extend to for higher order (third order or above) error dependences. In addition, cross-model parameter dependence may also be considered.

FIG. 5 shows inter-model second order error dependence. Diffuse horizontal irradiance (DHI) estimated by one individual model (model1) and GHI estimated by another model (model2) are shown with second order GHI estimate error indicated by the grayscale. According to FIG. 5, when DHI estimated by model 1 is high and GHI estimated by model 2 is high, the estimates are in the region indicated by 510, which is correlated with high second order error in GHI estimation. On the other hand, in the middle region indicated by 520, in which both the DHI estimate by model 1 and the GHI estimate by model 2 are approximately in the middle of the range of estimated values, the second order GHI estimation error correlated with this region (520) is the lowest. FIG. 5 illustrates a statistical correlation between these two independent models.

Based on the first and second order errors and on inter-model error correlation examined as exemplified in the discussion above, critical parameters are identified. These critical parameters are determined to have the highest (e.g., above a threshold) correlation with the error in estimating the parameter of interest. The same parameters may not be critical parameters in each individual model. However, the processes discussed above identify parameters that are deemed critical in at least one individual model. If the number of these critical parameters is only one or two, then blending the individual models may be achieved in a straight-forward manner by a weighted linear combination, for example. In most situations, based on the number of critical parameters, the blended model is obtained through machine learning with training datasets. The training data sets consider available historical data which fall in a number of subspaces, where each subspace is a particular combination of the critical parameters, each critical parameter set at a particular sub-range of its values. As noted above, a sub-range is not necessarily a continuous range of values. An exemplary embodiment for dividing the total historical data into subspaces involves using the estimation error of the parameter of interest. That is, within a subspace, the estimation error of the parameter of interest is similar. Once trained, the resulting blended model may be applied for estimation where the critical parameters fall in the same subspace. According to embodiments detailed below, the machine learning may be accomplished by a multi-expert based machine learning system. Additionally, according to embodiments detailed below, the issue of obtaining training datasets is addressed. That is, when (historical) training data is not available for the site of interest, proxy sites that provide comparable and sufficient training data to be used in generating a blended model that may then be applied to the site of interest are needed.

Figure 6:
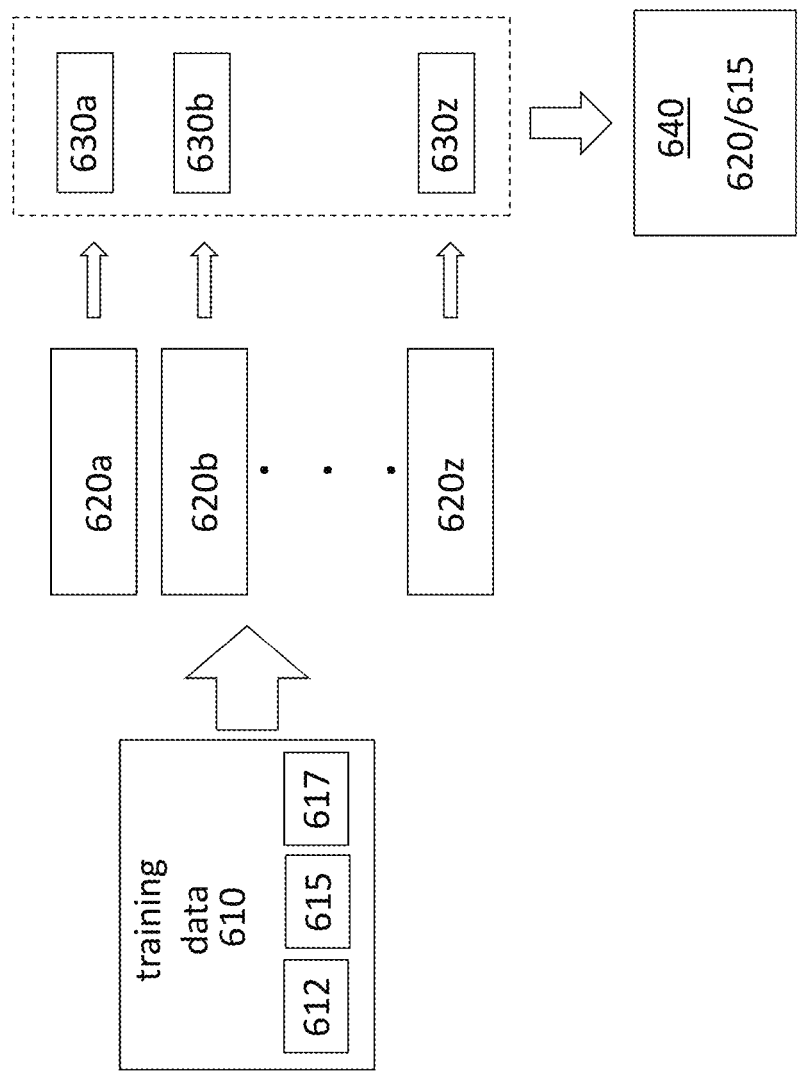
FIG. 6 is a process flow of a multi-expert based machine learning technique according to an embodiment.

FIG. 6 is a process flow of a multi-expert based machine learning technique according to an embodiment. The multi-expert based machine learning technique determines the most appropriate machine learning algorithm for a given situation (for a given subspace or range of values of the critical parameters). As detailed below, the multi-expert based machine learning determines the best machine learning algorithm with which to train a machine learning model for each situation. Initially, all the candidate machine learning algorithms are used to train the respective different machine learning models 620a through 620z using part of the available historical data 610 (estimates of all parameters (including the parameter of interest 612 and critical parameters 615) and, additionally, measurements of the parameter of interest 617). Only part of the available historical data 610 is used so that the remaining historical data 610 may be used to test the machine learning models 620. For example, if a year's worth of historical data 610 is available, only the first eleven months of data may be used to train the machine learning models 620. Exemplary machine learning algorithms 620 include a linear regression, random forest regression, gradient boosting regression tree, support vector machine, and neural networks. The estimates or predictions 630a through 630z of the parameter of interest (at various points of time) by each machine learning model 620a through 620z, respectively, are obtained for the period of time for which historical data 610 is available but was not used for training (e.g., the remaining month of the year in the example noted above). At each point in time, the machine learning model and corresponding critical parameters 620/615 associated with the most accurate prediction 630 among all the predictions 630 is determined. The accuracy is determined based on a comparison of the estimates 630*a* through 630*z* with the historical data 610 available for the period during which the estimates 630*a* through 630*z* are obtained. The resulting set of (most accurate) machine learning model and critical parameters 620/615 combinations is stored as the combinations 640 and is used to obtain the parameter-based blended model. That is, when the blended model is to be used, all critical parameters are estimated by all individual models. Based on the estimated ranges for the critical parameters 615, the corresponding machine learning model 620 from the stored combinations 640 is selected for use.

In alternate embodiments, the critical parameters 615 may be used to obtain the parameter-based blended model using another machine learning technique. That is, the combinations (640) of machine learning model and critical parameters 620/615 may be used to train a classification machine learning model to correlate the machine learning model 620 with critical parameters 615. Once the classification machine learning model is trained, inputting critical parameters 615 will result in obtaining the appropriate machine learning model 620 (parameter-based blended model).

In yet another embodiment, a single machine learning model 620 may be selected from among the set of most accurate machine learning models 620. For example, the machine learning model 620 that is most often the most accurate machine learning model 620 (for more points in time) may be selected as the parameter-based blended model. According to this embodiment, no correlation of machine learning model 620 to critical parameters 615 is needed.

The training data 610 discussed with reference to FIG. 6 may be historical and measured data from the site of interest. However, in some situations, training data specific to the site of interest (selected at block 110, FIG. 1) may not be available. The lack of site-specific training data may be addressed in a number of ways. According to an embodiment detailed below, sites are analyzed for similarities and categorized such that proxy sites may be identified when sites of interest fail to have training data.

Figure 7:
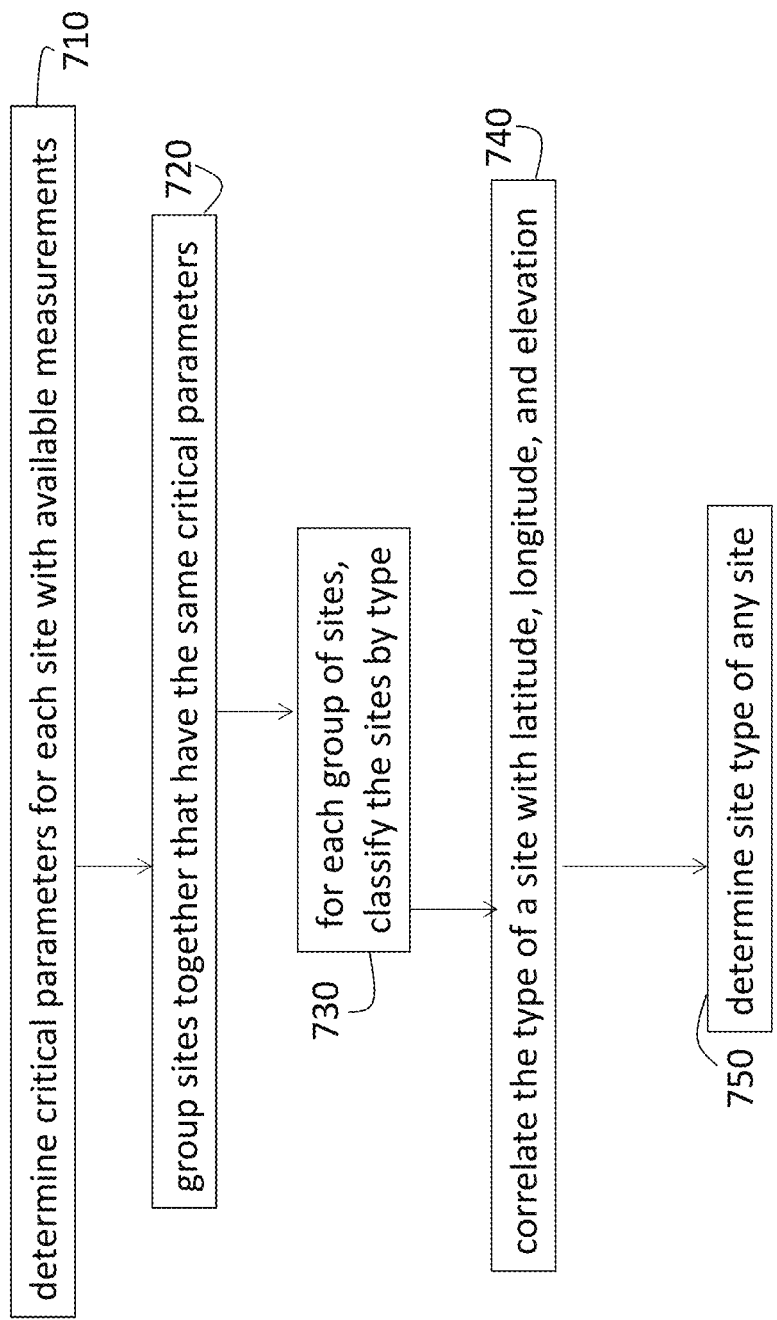
FIG. 7 shows a process flow of a method of classifying sites and obtaining proxy sites according to an embodiment.

FIG. 7 shows a process flow of a method of classifying sites and obtaining proxy sites according to an embodiment. At block 710, determining critical parameters for each site with available measurements may include performing the processes discussed above with reference to FIGS. 2-5. Grouping sites together that have the same critical parameters is performed at block 720. The sites within a given group must have all critical parameters in common rather than just a subset. For each group of sites, a further classification is then performed at block 730 that involves classifying the sites by type. This classification may be based on the estimation error dependence (of the parameter of interest) on the corresponding critical parameters of the group of sites, as detailed below. In alternate embodiments, static information of the site such as land type, elevation, latitude, longitude may be used in addition to the estimation error dependence for site classification (as additional coefficients). This classification at block 730 sorts the sites by type. At block 740, correlating the type of a site with its latitude, longitude, and elevation may include training a supervised classification model that correlates site type with latitude, longitude, and elevation. Exemplary algorithms for training the supervised classification model include the random forest algorithm, regression tree, support vector machine, and neural networks. The training data used to train the classification model is each site type determined at block 730 (response variable) and corresponding latitude, longitude, and elevation (predictor variables). A given site type may have multiple sites and, thus, multiple associated sets of latitude, longitude, and elevation combinations. Once the classification model is trained at block 740, determining a site type, at block 750, of any site is a matter of entering the latitude, longitude, and elevation of that site to the classification model for output of the site type. By using the site type, proxy sites (sites of the same type) may be identified from the original set of sites for which measurements were available (at block 710). As noted above with reference to FIG. 1, block 150, training data may be obtained from a proxy site when the site of interest has no historical or measured data available. One or more proxy sites may be used to provide the training data.

The classification at block 730 may begin with the first and second order error (in the estimate of the parameter of interest) dependence determined using FANOVA as discussed with reference to embodiments above. Polynomial models are fit to the first and second order error dependence for each site. For example, a linear model is fit to the first order error estimate and a quadratic model is fit to the second order error estimate. Thus, a first order error dependence curve (e.g., graph 210 in FIG. 2) is translated into two polynomial coefficients (the slope and intercept of the line fit to the graph) and a second order error dependence surface is translated to six coefficients. Accordingly, an individual site is associated with a set of polynomial coefficients corresponding to all of its first and second order error dependences of the parameter of interest. Using an unsupervised clustering machine learning algorithm (e.g., method of moments, k-means clustering, Gaussian mixture model, neural network), each site may be classified according to its set of coefficients. An input to the clustering machine learning algorithm is the number of total types of sites into which to sort the available sites. Given this number, the clustering algorithm may compute and use a measure of similarity among sets of coefficients (each set associated with a different site) to sort the sites.

In an alternative embodiment, the classification at block 730 and, specifically, the generation of the coefficients may be done differently. For each site, a linear model of the parameter of interest (y) may be fit to all or a subset of the critical parameters ($x_1$ through $x_n$) associated with the site. The coefficients ($a_1$ through $a_n$) may then be determined from the linear model ($y=a_1x_1+a_2x_2+ \ldots +a_nx_n$). This set of coefficients ($a_1 \ldots a_n$) rather than the coefficients obtained from the first order error dependence curve and second order error dependence surface, as discussed above, may be used with the clustering machine learning algorithm to sort the sites into sites types.

Figure 8:
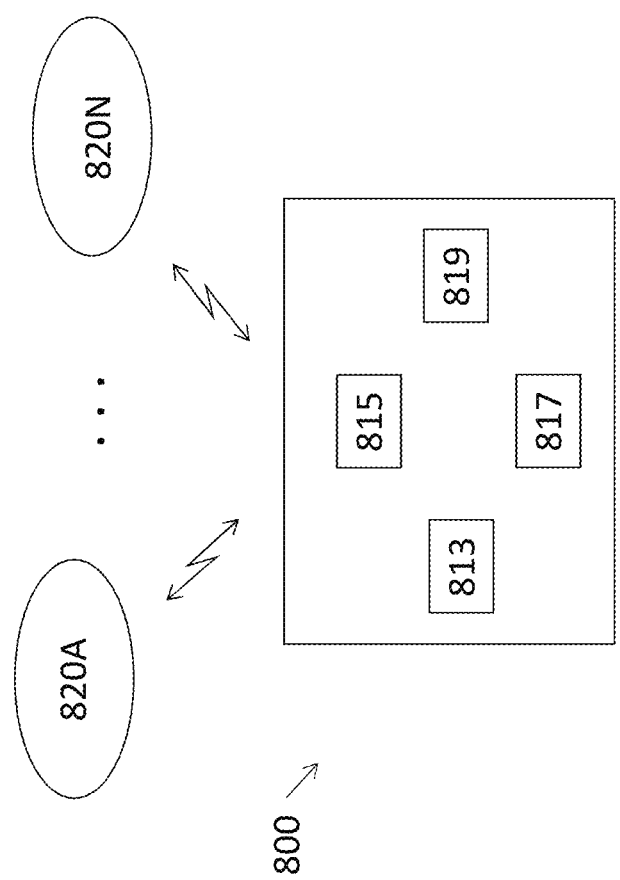
FIG. 8 is a block diagram of a multi-model blending system according to an embodiment of the invention

FIG. 8 is an overview of a multi-model blending system 800 according to an embodiment of the invention. The system 800 includes an input interface 813, one or more processors 815, one or more memory devices 817, and an output interface 819. The system 800 may communicate, wirelessly, through the internet, or within a network, for example, with one or more devices 820A through 820N (generally, 820). The other devices 820 may be other systems 800 or sources of training data or model outputs. That is, not all of the models may be executed within the multi-model blending system 800. Instead, one or more individual models may be implemented by another device 820 and the output (predicted or estimated parameters) provided to the input interface 813. For example, in the exemplary case of multi-model blending of meteorological models, device A 820A may be The National Weather Service or another organization that executes a model to forecast weather and provides the model output. The processes detailed above (including identifying critical parameters and classifying site types) may be executed by the system 800 alone or in combination with other systems and devices 820. For example, the input interface 813 may receive information about the parameter of interest and the site of interest (and the number of site types), as well as receive training data or model outputs. The processor may determine the critical parameters for a set of models providing a given parameter of interest, as detailed above.

All of the embodiments discussed herein ultimately improve the area in which the forecast or estimate is provided. For example, when the individual models used, as described above, relate to weather forecasting, the embodiments detailed herein improve the weather forecast, or when the individual models relate to corrosion forecasting, the embodiments detailed herein improve the forecast and, thus, reliability in the pipeline industry.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A multi-expert based machine learning method to determine a blended forecasting model, the method comprising:

running a set of individual models to identify critical parameters, wherein the critical parameters are determined to be critical to estimation of a parameter of interest, wherein the identifying the critical parameters includes examining first order dependence and second order dependence of an error in the estimation of the parameter of interest associated with each of the parameters estimated by each of the set of individual models and wherein examining the first order dependence includes translating a first order error dependence curve into two coefficients and examining the second order dependence includes translating a second order error dependence surface into six coefficients, wherein each individual model from the set of individual models is associated with a particular site of a set of sites and wherein each site from the set of sites has a corresponding latitude, longitude, and elevation;

storing historical data, the historical data including estimates and measurements of the parameter of interest and estimates of the critical parameters;

obtaining training data as the historical data with a particular combination of values of the critical parameters;

correlating a type associated with each site with the latitude, the longitude, and the elevation of the site by training a plurality of machine learning models, which are different than any of the set of individual models, with respective machine learning algorithms using the training data that includes a first set of parameter values associated with a first range of time points, the first set of parameter values being obtained from the historical data, wherein the training the plurality of the machine learning models with the machine learning algorithms includes training the plurality of the machine learning models to correlate the site type with the latitude, the longitude, and the elevation of the site;

obtaining estimates of the parameter of interest with each of the machine learning models using the training data that includes a second set of parameter values associated with a second range of time points, the second set of parameter values being obtained from the historical data;

determining, using a processor, a most accurate machine learning model among the machine learning models at each time point in the second range of time points; and determining the blended forecasting model based on the most accurate machine learning model determined for each time point in the second range of time points by training a classification machine learning model to correlate, for each time point in the second range of time points, the most accurate machine learning model with corresponding values of the critical parameters in the historical data and inputting the corresponding values of the critical parameters into the trained classification machine learning model, wherein the blended forecasting model corresponding with critical parameters is determined as the most accurate machine learning model correlated with the critical parameters.

2. The method according to claim 1, wherein each of the machine learning algorithms blends the set of individual models.

3. The method according to claim 2, further comprising obtaining estimates of the critical parameters from the set of individual models to determine the blended forecasting model.

4. The method according to claim 1, wherein the training the plurality of the machine learning models with the machine learning algorithms includes training with a linear regression, random forest regression, gradient boosting regression tree, support vector machine, or neural network.

5. The method according to claim 1, wherein the determining the most accurate machine learning model at each time point in the second range of time points includes comparing the respective estimate of the parameter of interest obtained with each of the machine learning models at the associated time point with a corresponding measurement of the parameter of interest in the historical data.

6. The method according to claim 1, wherein the determining the blended forecasting model includes selecting one of the machine learning models determined as the most accurate machine learning model as the blended forecasting model.

7. A multi-expert based machine learning system to determine a blended forecasting model, the system comprising:
a memory device to store historical data of parameters, the historical data including estimates and measurements of a parameter of interest and estimates of critical parameters determined to be critical to an estimate of the parameter of interest, wherein the critical parameters are identified based on running a set of individual models, wherein the critical parameters are identified by examining first order dependence and second order dependence of an error in the estimation of the parameter of interest associated with each of the parameters estimated by each of the set of individual models and wherein examining the first order dependence includes translating a first order error dependence curve into two coefficients and examining the second order dependence includes translating a second order error dependence surface into six coefficients, wherein each individual model from the set of individual models is associated with a particular site of a set of sites and wherein each site from the set of sites has a corresponding latitude, longitude, and elevation; and
a processor configured to obtain training data as the historical data with a particular combination of values of the critical parameter, to correlate a type associated with each site with the latitude, the longitude, and the elevation of the site by training a plurality of learning models, which are different than any of the set of individual models, with respective machine learning algorithms using the training data that includes a first set of parameter values associated with a first range of time points obtained from the historical data, wherein the training the plurality of the machine learning models with the machine learning algorithms includes training the plurality of the machine learning models to correlate the site type with the latitude, the longitude, and the elevation of the site, to obtain estimates of the parameter of interest with each of the machine learning models using the training data that includes a second set of parameter values associated with a second range of time points, the second set of parameter values being obtained from the historical data, to determine a most accurate machine learning model among the machine learning models at each time point in the second range of time points, and to determine the blended forecasting model from the most accurate machine learning models by training a classification machine learning model to correlate, for each time point in the second range of time points, the most accurate machine learning model with corresponding values of the critical parameters in the historical data and inputting the corresponding values of the critical parameters into the trained classification machine learning model, wherein the blended forecasting model corresponding with critical parameters is determined as the most accurate machine learning model correlated with the critical parameters.

8. The system according to claim 7, wherein each of the machine learning algorithms blends the set of individual models.

9. The system according to claim 8, wherein the set of individual models estimates the critical parameters.

10. The system according to claim 7, wherein the machine learning algorithms include training with a linear regression, random forest regression, gradient boosting regression tree, support vector machine, or neural network.

11. The system according to claim 7, wherein the processor compares the respective estimate of the parameter of interest obtained with each of the machine learning models at the associated time point in the second range of time points with a corresponding measurement of the parameter of interest in the historical data to determine the most accurate machine learning model at each time point in the range of time points.

12. A non-transitory computer program product having computer readable instructions stored thereon which, when executed by a processor, cause the processor to implement a method of determining a blended forecasting model, the method comprising:
obtaining historical data, the historical data including estimates and measurements of a parameter of interest and estimates of critical parameters, the critical parameters determined to be critical to an estimate of the parameter of interest, wherein the critical parameters are identified based on running a set of individual models, wherein the critical parameters are identified by examining first order dependence and second order dependence of an error in the estimation of the parameter of interest associated with each of the parameters estimated by each of the set of individual models and wherein examining the first order dependence includes translating a first order error dependence curve into two coefficients and examining the second order dependence includes translating a second order error dependence surface into six coefficients, wherein each individual model from the set of individual models is associated with a particular site of a set of sites and wherein each site from the set of sites has a corresponding latitude, longitude, and elevation;
obtaining training data as the historical data with a particular combination of values of the critical parameters;
correlating a type associated with each site with the latitude, the longitude, and the elevation of the site by training a plurality of machine learning models, which are different than any of the set of individual models, with respective machine learning algorithms using the training data that includes a first set of parameter values associated with a first range of time points, the first set of parameter values being obtained from the historical data, wherein the training the plurality of the machine learning models with the machine learning algorithms includes training the plurality of the machine learning models to correlate the site type with the latitude, the longitude, and the elevation of the site;

obtaining estimates of the parameter of interest with each of the machine learning models using the training data that includes a second set of parameter associated with a second range of time points, the second set of parameter values being obtained from the historical data;

determining a most accurate machine learning model among the machine learning models at each time point in the second range of time points; and determining the blended forecasting model based on the most accurate machine learning model determined for each time point in the second range of time points by training a classification machine learning model to correlate, for each time point in the second range of time points, the most accurate machine learning model with corresponding values of the critical parameters in the historical data and inputting the corresponding values of the critical parameters into the trained classification machine learning model, wherein the blended forecasting model corresponding with critical parameters is determined as the most accurate machine learning model correlated with the critical parameters.

13. The non-transitory computer program product according to claim 12, wherein each of the machine learning algorithms blends the set of individual models.

14. The non-transitory computer program product according to claim 13, further comprising obtaining estimates of the critical parameters from the set of individual models to determine the blended forecasting model.

15. The non-transitory computer program product according to claim 12, wherein the training the plurality of the machine learning models with the machine learning algorithms includes training with a linear regression, random forest regression, gradient boosting regression tree, support vector machine, or neural network.

16. The non-transitory computer program product according to claim 12, wherein the determining the most accurate machine learning model at each time point in the second range of time points includes comparing the respective estimate of the parameter of interest obtained with each of the machine learning models at the associated time point with a corresponding measurement of the parameter of interest in the historical data.

* * * * *